(12) United States Patent
Chuang et al.

(10) Patent No.: US 9,209,243 B2
(45) Date of Patent: Dec. 8, 2015

(54) METHOD OF FORMING A SHALLOW TRENCH ISOLATION STRUCTURE

(71) Applicant: Taiwan Semiconductor Manufacturing Company, Ltd., Hsin-Chu (TW)

(72) Inventors: Chia-Yi Chuang, Taipei (TW); Ta-Hsiang Kung, New Taipei (TW); Hsing-Jui Lee, Hsin-Chu (TW); Ming-Te Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/621,245

(22) Filed: Feb. 12, 2015

(65) Prior Publication Data

US 2015/0155352 A1  Jun. 4, 2015

Related U.S. Application Data

(62) Division of application No. 13/938,948, filed on Jul. 10, 2013, now Pat. No. 8,975,155.

(51) Int. Cl.
*H01L 29/00* (2006.01)
*H01L 29/06* (2006.01)
*H01L 21/762* (2006.01)

(52) U.S. Cl.
CPC ...... *H01L 29/0649* (2013.01); *H01L 21/76224* (2013.01)

(58) Field of Classification Search
CPC .................. H01L 21/76224; H01L 21/76232; H01L 21/76229; H01L 21/823481; H01L 21/76264
USPC ......................................... 257/501, 506, 510
See application file for complete search history.

(56) References Cited

U.S. PATENT DOCUMENTS

| 7,163,869 | B2 | 1/2007 | Kim et al. |
| 7,659,181 | B2 | 2/2010 | Smythe, III et al. |
| 8,278,185 | B2 * | 10/2012 | Koo et al. ............ 438/435 |
| 8,772,904 | B2 * | 7/2014 | Liu et al. ............ 257/510 |

* cited by examiner

*Primary Examiner* — Quoc Hoang
(74) *Attorney, Agent, or Firm* — Slater & Matsil, L.L.P.

(57) ABSTRACT

Embodiments of the disclosure include a shallow trench isolation (STI) structure and a method of forming the same. A trench is formed in a substrate. A silicon oxide and a silicon liner layer are formed on sidewalls and a bottom surface of the trench. A flowable silicon oxide material fills in the trench, is cured, and then is partially removed. Another silicon oxide is deposited in the trench to fill the trench. The STI structure in a fabricated device includes a bottom portion having silicon oxide and a top portion having additionally a silicon oxide liner and a silicon liner on the sidewalls.

21 Claims, 5 Drawing Sheets

METHOD OF FORMING A SHALLOW TRENCH ISOLATION STRUCTURE

This application is a divisional of U.S. patent application Ser. No. 13/938,948, filed on Jul. 10, 2013, and entitled "Method of forming a shallow trench isolation structure," which application is incorporated herein by reference in its entirety.

TECHNICAL FIELD

The present invention relates generally to methods for manufacturing semiconductor devices, and more particularly to manufacturing methods for a shallow trench isolation structure.

BACKGROUND

Generally, shallow trench isolations (STIs) are used to separate and isolate active areas on a semiconductor wafer from each other. These STIs have historically been formed by etching trenches, sometimes referred to as gaps, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

However, as circuit densities continue to increase, the widths of these gaps decrease, thereby increasing gap aspect ratios, which are typically defined as the gap height divided by the gap width. As a result, it is very difficult to fill these narrow and deep gaps completely with a gap-fill dielectric material. Incomplete filling results in unwanted voids and discontinuities in the gap-fill dielectric material as well as inclusion of unwanted material. These voids and inclusions result in inadequate isolation between active areas. Electrical performance of a device with inadequate isolation is poor and device yield is reduced.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

As transistor sizes decrease, the size of each feature decreases. One such feature is the shallow trench isolation (STI) used between active areas to isolate one semiconductor device from another. As discussed, the feature size reduction results in increased aspect ratios because the openings are smaller but not the depth of the STI. Techniques used to fill STIs having an aspect ratio of 5 or less cannot be used to adequately fill STIs of advanced technologies having aspect ratios of 8 or more. In many chemical vapor deposition (CVD) processes, a plasma is used with silicon-containing precursors and oxygen-containing gas to form silicon oxide directly on the surface of the substrate. These plasma-based CVD processes forms silicon oxide as deposited; however, they fill poorly for high aspect ratio gaps.

One alternative to improve filling pertains to using flowable dielectric materials instead of conventional silicon oxide as deposited. Flowable dielectric materials, as their name suggest, can flow to fill voids in a gap. Usually, various chemistries are added to the silicon-containing precursors to allow the deposited film to flow. In some examples, nitrogen hydride bonds are added. Examples of flowable dielectric precursors, particularly flowable silicon oxide precursors, include a silicate, a siloxane, a methyl SilsesQuioxane (MSQ), a hydrogen SisesQuioxane (HSQ), an MSQ/HSQ, a perhydrosilazane (TCPS) or a perhydro-polysilazane (PSZ). These flowable silicon oxide materials are formed in a multiple step process. After the flowable film is deposited, it is cured and then annealed to remove the added chemistry to form silicon oxide. When the added chemistry is removed, the flowable film densifies and shrinks. The curing and annealing may result in oxidation of the trench walls. Such oxidation increases the STI size and reduces the active area used by the semiconductor device and may have a detrimental effect on the device performance. The flowable film is cured and annealed at a high temperature, up to 1200 degrees Celsius, and for a long time, for a total of 30 hours or more. The cure and anneal significantly reduces the thermal budget allowed for the rest of the semiconductor manufacturing process.

Figure 1:
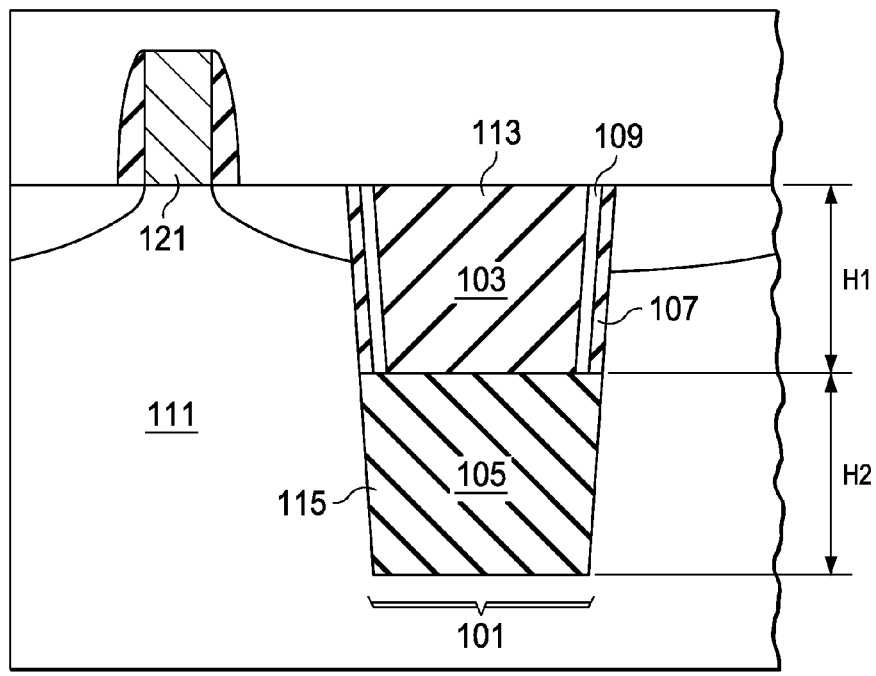
FIG. 1 is a cross-sectional view of a shallow trench isolation structure according to embodiments of this disclosure.

Various aspects of the present disclosure pertain to structure and method for making an STI with the void-less filling associated with flowable silicon oxides with smaller reduction in the thermal budget and eliminating unwanted oxidation at the silicon trench walls. FIG. 1 is a cross section schematic of a partially fabricated semiconductor device 100 according to various embodiments of the present disclosure. The STI structure 101 includes two portions: a top portion 103 and a bottom portion 105. The top portion 103 has a height H1 and includes at least three layers. Proceeding toward the center of the STI from the silicon substrate 111 (i.e. from the trench sidewalls), the first layer is a silicon oxide liner 107, the second layer is a silicon liner 109, and the third portion is a silicon oxide 113. The bottom portion 105 has a height H2 and includes only silicon oxide 115 between the silicon substrate walls; however, trace amounts of elemental silicon and/or nitrogen hydride may be present in the bottom portion.

A ratio of the heights H1 and H2 may be between about 0.1 to about 4, or between about 0.1 to about 1. The ratio of H1 and H2 varies across the semiconductor wafer depending on local densities and STI sizes. The same processes may result in an H1/H2 ratio of about 0.5 in a relatively dense area with high aspect ratio STIs and an H1/H2 ratio of about 4 in a less dense area with low aspect ratio STIs on the same wafer.

Figure 10:
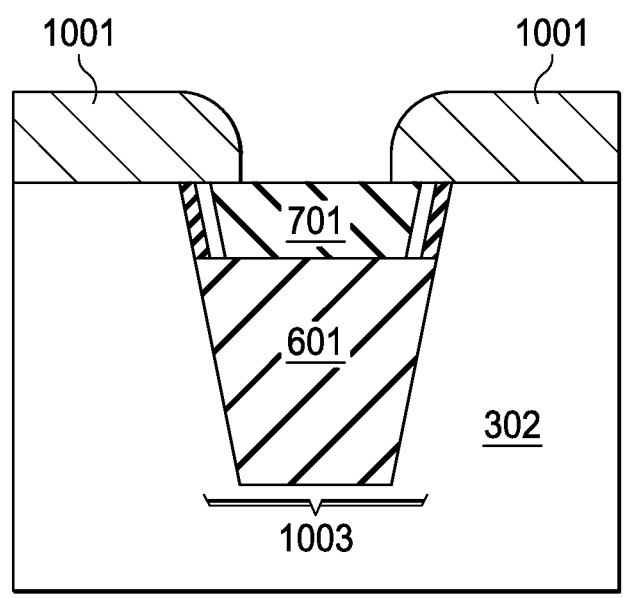

The STI structure 101 has a smooth profile from the bottom portion 105 to the top portion 103. The bottom portion does not include a silicon oxide liner and a silicon liner. As shown in FIG. 1, the silicon oxide fill in the bottom portion has a top surface area larger than a bottom surface area of the silicon oxide fill in the top portion. While the cross section of STI structure of FIG. 1 is shown parallel to a gate 121 of a transistor, in other cross sections the STI structure is perpendicular to the gate structure as the STI peripherally surrounds the transistor. A portion of the gate overlaps the STI structure in some cross sections, as shown in FIG. 10.

Figure 2:
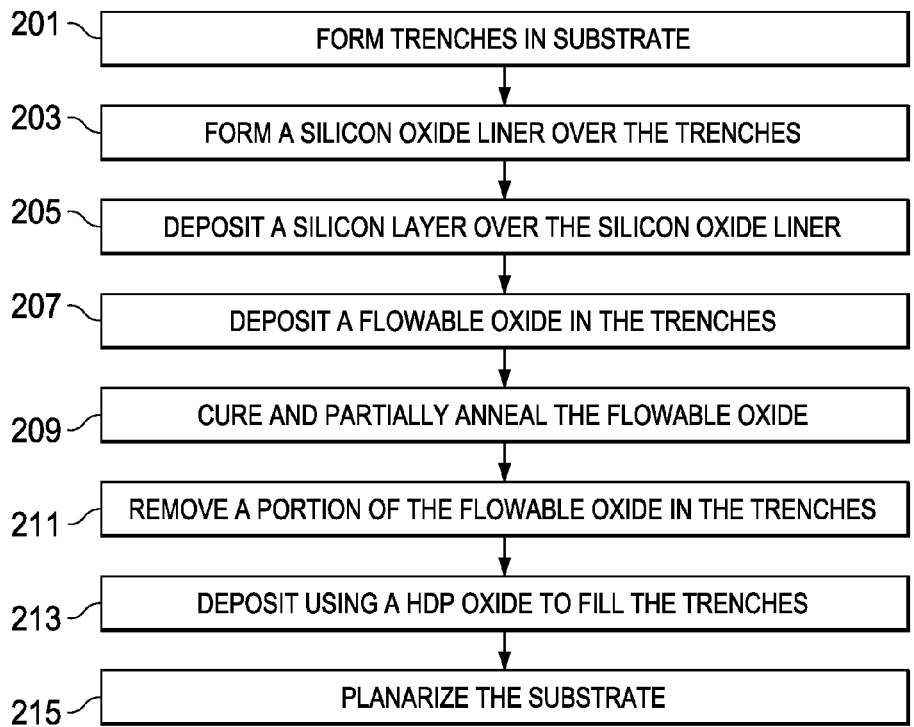
FIG. 2 is a flow chart of a method for fabricating a shallow trench isolation structure.

FIG. 2 is a flowchart of a method 200 for fabricating STI structures according to various embodiment of the disclosure. FIGS. 3 to 10 are cross-sectional views of an STI structure at various stages of manufacture.

Figure 3:
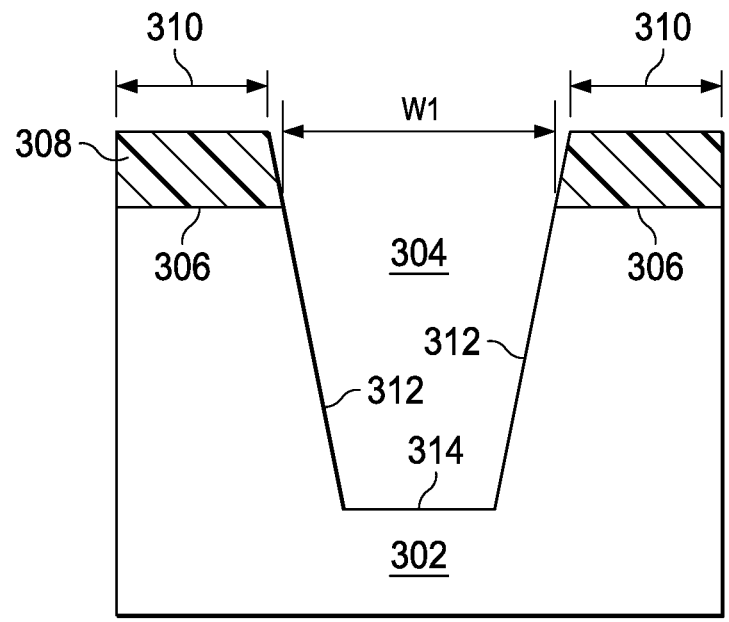
FIGS. 3 to 10 are cross-sectional views of a shallow trench isolation structure at various fabrication stages according to various embodiments of this disclosure.

Referring to FIG. 2 and FIG. 3, in operation 201, a trench 304 is formed in substrate 302. The trench formation includes multiple operations of patterning the substrate and etching the substrate. The substrate 302 may be bulk silicon, doped or undoped, or an active layer of a silicon on insulator (SOI) substrate. Generally, an SOI substrate includes an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

Patterning the substrate includes forming a mask layer 308 on the top surface 306 of the substrate 302 and patterning the mask layer 308 to exposes an opening around active areas 310 on the top surface 306. The active areas 310 are electrically conductive regions of the substrate 302 adjacent to the top surface 306 of the substrate 302. The active areas 310 are used for components of active devices (such as transistors, resistors, etc.) to be formed later. The active areas 310 are preferably formed by the implantation of suitable materials into the crystal silicon substrate. Depending upon the materials chosen, the active areas 310 may comprise either an n-well or a p-well as determined by the design requirements.

The masking layer 308 may be a hardmask comprising silicon nitride formed through a process such as chemical vapor deposition (CVD), although other materials, such as oxides, oxynitrides, silicon carbide, and combinations of these may alternatively be utilized. Other deposition processes, such as plasma enhanced chemical vapor deposition (PECVD), low pressure chemical vapor deposition (LPCVD), or silicon oxide formation followed by nitridation, may alternatively be utilized. Once formed, the masking layer 308 is patterned through suitable photolithographic and etching processes to form the opening and expose those portions of the substrate 302.

The exposed portions of the substrate 302 through the opening are removed by a suitable process such as reactive ion etching (RIE) in order to form the trench 304 in the substrate 302. The trench 304 separates active areas 310 on the top surface 306 of the substrate 302. The trench 304 comprises sidewalls 312 and a bottom surface 314. In some embodiments, the trench 314 has a width W1 that is not more than 42 nm. An aspect ratio, the trench depth (sometimes referred to herein as trench height) divided by the trench width W1, of some of the trenches 304 is greater than about 8 or greater than 10.

Figure 4:
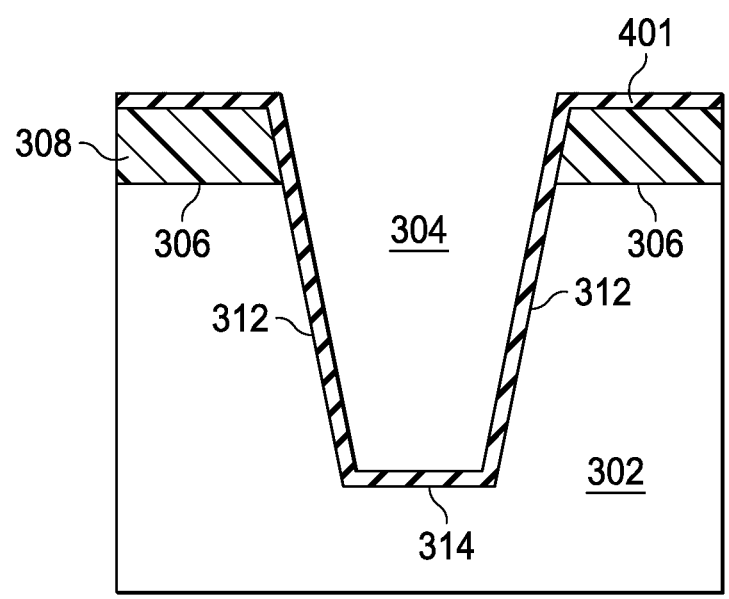

Referring to FIG. 2 and FIG. 4, in operation 203, a silicon oxide liner 401 is formed in the trenches on the sidewalls 312 and bottom surface 314. The silicon oxide liner 401 may be formed in one or two operations. In some embodiments, the silicon oxide liner 401 is one layer that is thermally grown on the silicon walls of the trench 304. The substrate is exposed to an oxygen-containing environment at a high temperature and the surface exposed to the oxygen is converted to silicon oxide. In certain embodiments, the oxygen-containing environment includes steam. The silicon oxide liner may include additional layer or layers over the thermally grown silicon oxide. In one example, an additional silicon oxide layer may be deposited using plasma enhanced atomic layer deposition (PEALD). According to various embodiments, the silicon oxide liner is formed to protect the silicon substrate 302 underlying the silicon oxide liner 401 from subsequent oxidation. A dense silicon oxide film such as a thermal oxide film is used to shield the underlying silicon substrate 302 from oxidation chemistry in subsequent processing. The silicon oxide liner 401 is relatively thin, in the order of tens to a hundred angstroms, in order to minimize an increase in the aspect of the already high aspect-ratio trench to be filled. In some embodiments, the silicon oxide liner is less than about 30 angstroms.

Figure 5:
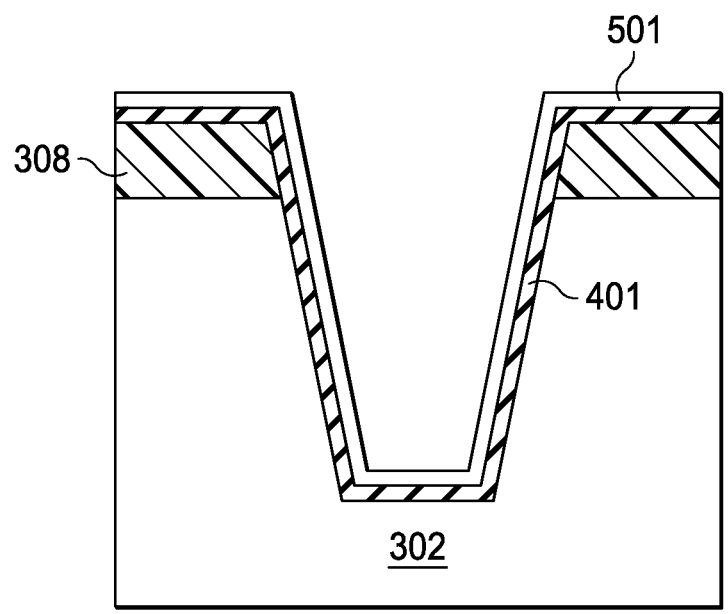

Referring to FIG. 2 and FIG. 5, in operation 205 a silicon liner layer 501 is deposited over the silicon oxide liner 401. In various embodiments, the silicon liner layer 501 is amorphous silicon or polysilicon. A thickness of the silicon liner layer 501 is between about 10 Å to about 40 Å. In some embodiments, the silicon liner layer 501 is about 25 Å. The silicon liner layer 501 may be formed by using a furnace system in a gaseous environment containing $Si_2H_6$, $SiH_4$, $Si_3H_8$, $SiCl_2H_2$ or $SiCl_3H$. In one embodiment, the flow rates of $Si_2H_6$ should be in the range of about 10 standard cubic centimeters per minute (sccm) to about 1000 sccm. A temperature for the formation of the silicon liner layer 501 is in a rage of about 200° C. to about 600° C. A pressure range for the formation of the silicon liner layer 501 is from about 10 mTorr to about 10 Torr. Alternatively, the silicon liner layer 501 may be formed by using a deposition technique that can form a conformal silicon layer, such as the low temperature chemical deposition process in a gaseous environment containing $Si_3H_8$, $SiH_4$, $SiCl_2H_2$ or $SiCl_3H$. The gas environment also comprises a carrier gas such as $H_2$. The carrier gas helps to better control treatment uniformity. In one embodiment, the flow rates of $Si_3H_8$ and $H_2$ should be in the range of about 10 standard cubic centimeters per minute (sccm) to about 1000 sccm, and of about 5 standard liters per minute (slm) to about 50 slm, respectively. A temperature for the formation of the silicon liner layer 501 in the chemical deposition process is in a range of about 250° C. to 550° C.

Figure 6:
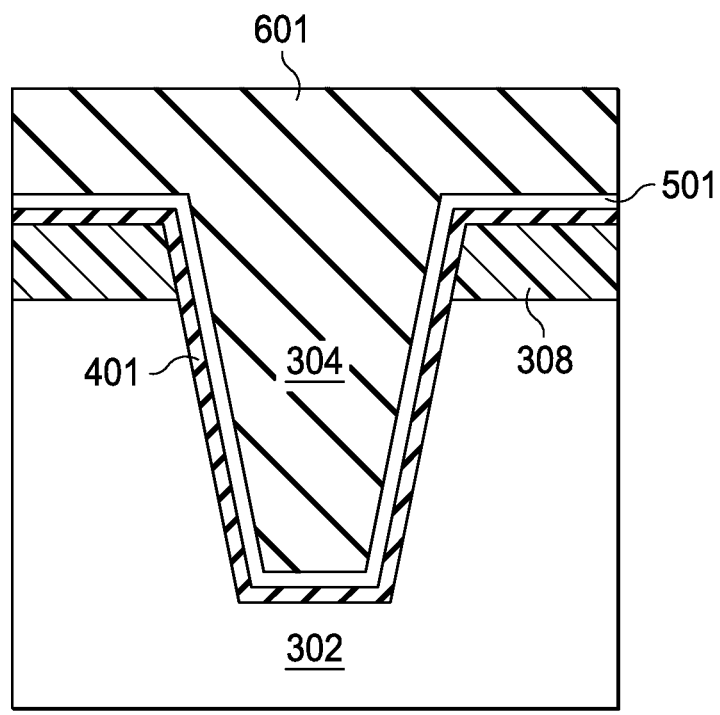

Referring to FIG. 2 and FIG. 6, in operation 207 a flowable dielectric material 601 overfills the trenches 304 and the masking layer 308 to form a flowable dielectric film. The flowable dielectric film 601 may comprise a flowable silicon oxide or silicon nitride dielectric material. The flowable dielectric film 601 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydro-polysilazane (PSZ). Alternatively, the flowable dielectric film 601 can be formed by using a low temperature plasma chemical vapor deposition at a temperature less than about 100° C. under a pressure ranging from about 100 mTorr to about 10 Torr. A reaction source uses a gaseous environment containing $Si_3H_9N$ and $NH_3$. In one embodiment, the flow rates of $Si_3H_9N$ and $NH_3$ should be in the range of about 100 standard cubic centimeters per minute (sccm) to about 1000 sccm, and of about 100 sccm to about 2000 sccm, respectively. This particular dielectric film could be formed by an Alectrona® system, which is offered by Applied Materials of Santa Clara, Calif. The flowable dielectric film 601 is capable of filling the narrow and deep gaps and prevents voids and discontinuities in the STI structure.

Figure 7:
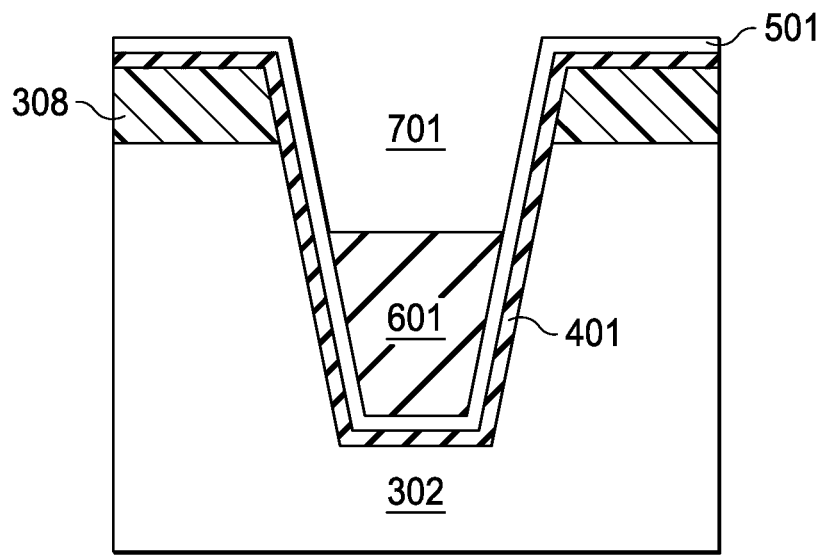

Referring to FIG. 7, in operation 209, a curing and a partial anneal process is performed on the flowable dielectric material 601 in the trench 304. In one embodiment, the curing process is operated in a flow rate of $O_3$ or steam in the range of about 100 standard cubic centimeters per minute (sccm) to about 5000 sccm, and of about 100 sccm to about 5000 sccm, respectively. A temperature for the curing process is in a rage of about 10° C. to about 500° C. A pressure range for the curing process is from about 1 Torr to about 760 Torr. The cured flowable dielectric film includes nitrogen hydride bonds and is less dense than a silicon oxide film as deposited. The partial anneal process involves heating the flowable oxide at a temperature of between 200 degrees Celsius and about 1100 degrees Celsius for more than ten hours in an oxygen environment, including steam or ozone. In some embodiments, the partial anneal process has a duration of about 15 hours. The partial anneal process transforms the Si—O bond network and densifies the dielectric material to enable further process on the semiconductor substrate. Further annealing is to be performed to completely convert the cured flowable dielectric film to a silicon oxide. According to various embodiments, after the curing, at least a portion of the silicon liner 501 and the silicon oxide 401 liner remain in the trench. According to various embodiments, the cure and partial anneal of the flowable oxide occurs in one processing tool and may be considered one operation. After operation 209, the flowable oxide is referred to as the cured flowable oxide.

Referring to FIG. 2 and FIG. 7, in operation 211, a portion of the cured flowable oxide in the trenches is removed. A wet clean process may be used to remove the portion. The wet clean involves exposing the semiconductor substrate having the cured flowable oxide thereon to an etching solution. The etching solution may be a hydrochloric acid-hydrogen peroxide mixture (HPM), sulfuric acid-hydrogen peroxide mixture (SPM), or ammonium hydroxide-hydrogen peroxide mixture (APM). In certain embodiments, the etching solution is a dilute hydrofluoric acid solution. The amount of the cured flowable oxide removed is controlled by the duration of exposure and the etchant. For example, if a 50% removal is desired for the STI structure in dense regions, then the wet clean process is tuned so that the combination of etchant and duration would result in the desired removal. The same process may remove more or less cured flowable oxide in other regions of the substrate. For example, a 50% removal in the dense areas where the trenches have high aspect ratios may result in 80% removal in less dense areas where the trenches have lower aspect ratios. According various embodiments, the removed portion of the cured flowable dielectric film results in a new trench 701 that has an aspect ratio that can be readily filled with silicon oxide as deposited. The silicon liner 501 and silicon oxide liner 401 are not removed.

Figure 8:
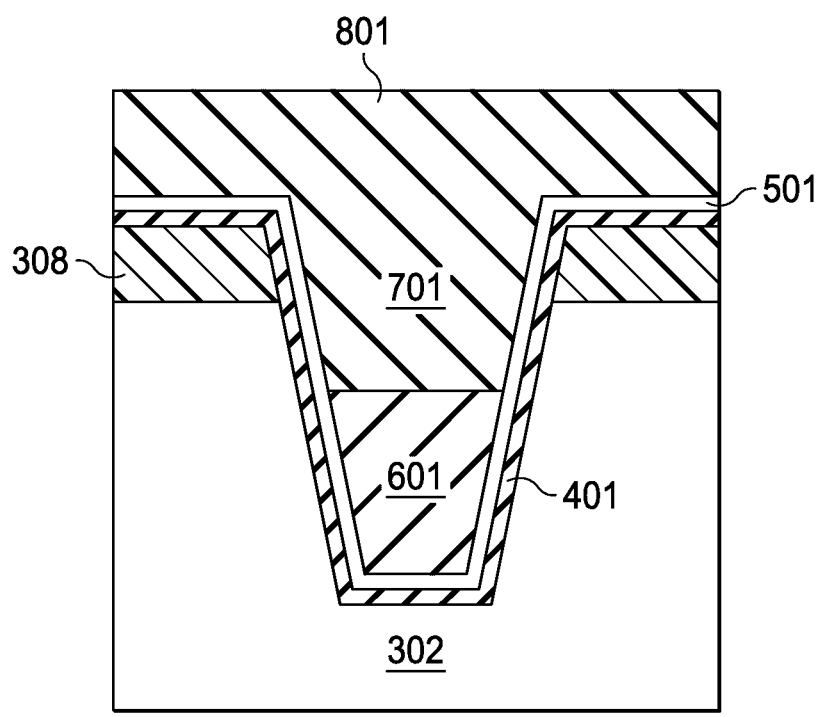

Referring to FIG. 2 and FIG. 8, in operation 213, a silicon oxide as deposited 801 fills the trenches 701 formed by removing a portion of the flowable dielectric film. According to various embodiments, these trenches 701 have an aspect ratio of about 5 or less. In some embodiments, a high density plasma (HDP) CVD process is used to fill these trenches 701. The HDP CVD process deposits silicon oxide 801 that does not need to be converted. The silicon oxide as deposited 801 is harder than the underlying cured flowable dielectric film 601. The HDP CVD process may include multiple steps of deposition, etch, and deposition until the trench 701 is completely filled. In other embodiments, other types of silicon oxide deposition technique may be used. Other techniques include high aspect ratio process (HARP) alone to together with some HDP CVD and other CVD techniques. In order to reduce the total thermal budget, the silicon oxide is deposited using a technique that completely fills the gap without having to be converted to silicon oxide by thermal annealing.

Figure 9:
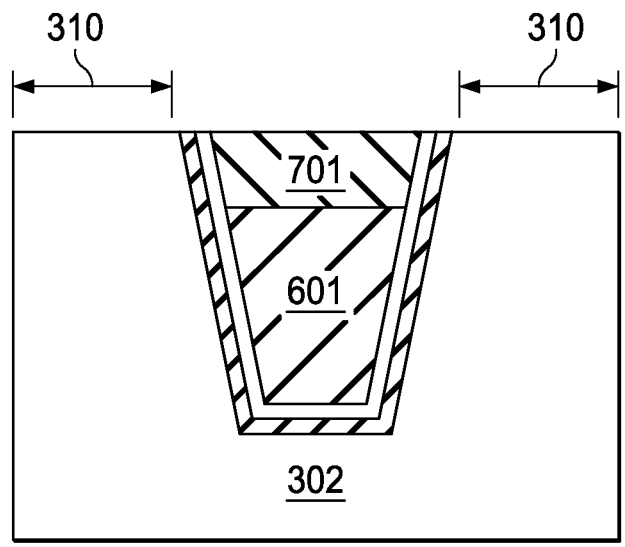

Referring to FIG. 2 and FIG. 9, in operation 215, the substrate is planarized. The excess HDP oxide outside of the trenches and masking layer is removed through a process such as chemical mechanical polishing (CMP), an etch, or a combination of these. The removal process preferably removes any material, including the silicon liner and silicon oxide liner that are located over the masking layer as well, so that the removal of the masking layer will expose the active areas 310 to further operations.

During subsequent semiconductor fabrication, the cured flowable dielectric film is completely annealed to densify and remove the nitrogen hydride bonds. A partial anneal was performed in operation 209 of FIG. 2. The remaining anneal process occurs during any dopant activation anneal such as occurring with forming contacts regions, source regions and drain regions, including lightly doped source and drain regions and silicidation. Thus no additional annealing as part of the STI structure formation process is used. The subsequent anneal converts the silicon liner layer around the cured flowable dielectric film into a silicon oxide layer so that no voids or low density regions form in the bottom portion of the STI structure as result of the cured flowable dielectric film densifying. In one embodiment, the subsequent anneal process is performed in an environment containing steam in a flow rate of about 1 slm to about 10 slm. The anneal process is at a temperature in a range of about 1000° C. to about 1200° C. The anneal process starts at about 200° C. and ramps up the temperature gradually to a predetermined temperature of about 1000° C. to about 1200° C. Thus, one feature of the present disclosure pertains to a reduced thermal processing for the annealing of the flowable oxide because the second anneal where the flowable oxide is completely annealed occurs concurrently with other anneals performed on the substrate.

FIG. 10 is cross section of the completed STI structure after the subsequent annealing with the silicon liner consumed by the annealing and the silicon oxide liner integrating into the resulting structure. The cut line for the cross section of FIG. 10 is perpendicular to that of FIG. 1, showing two gates 1001 from adjacent transistors partially overlapping the STI structure 1003. As discussed, the STI structure peripherally surrounds an active area that may include various semiconductor devices. In the case of adjacent planar transistors, a portion of the gate stack would overlap into the STI region. According to various embodiments, having the HDP oxide at the surface of the overlap improves the isolation between active regions and adhesion of the gate structure.

One aspect of the present disclosure pertains to a shallow trench isolation (STI) structure. The STI structure includes a bottom portion having a first silicon oxide peripherally enclosed by a silicon substrate and a top portion having a silicon oxide liner peripherally enclosed by the silicon substrate, a silicon liner peripherally enclosed by the silicon oxide liner, and a second silicon oxide peripherally enclosed by the silicon liner. A top surface area of the first silicon oxide is greater than a bottom surface of the second silicon oxide. A ratio of the height of the top portion to a height of the bottom portion may be less than about 4. An aspect ratio of the top portion may be about five or less. The second silicon oxide may be a high density plasma (HDP) oxide. The bottom portion may include trace amounts of a nitrogen hydride or silicon.

Another aspect of the present disclosure pertains to methods of forming an STI structure. The method includes forming a trench in a substrate, forming a silicon oxide liner on sidewalls and bottom surface of the trench, depositing a silicon liner layer over the silicon oxide liner, filling a flowable silicon oxide in the trench, curing and partially annealing the flowable silicon oxide, removing a portion of the cured flowable silicon oxide in the trench, depositing a second silicon oxide in the trench, the second silicon oxide being not a flowable silicon oxide, and planarizing the substrate.

Yet another aspect of the present disclosure pertains to methods of forming an STI structure. The method includes providing a substrate comprising a top surface and forming a plurality of first trenches extending from the top surface into the substrate. The trench has sidewalls and a bottom surface and at least a portion of the plurality of trenches having aspect ratios greater than about 8. The method also includes forming a silicon oxide liner on the sidewalls and the bottom surfaces, forming an amorphous silicon liner layer on the silicon oxide liner, filling a flowable oxide material in trench, curing and partially annealing the flowable oxide material in a gaseous environment containing water, and removing a portion of the cured flowable oxide material to form second trenches having a sidewall of the amorphous silicon liner. The second trenches have aspect ratios less than about 5. The method further includes filling the second trenches with a silicon oxide that are formed as deposited, planarizing the substrate, forming transistor gate structures, source regions, and drain regions in active areas. The forming of gate structures, source, regions, and drain regions also anneals the cured flowable oxide material.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A shallow trench isolation (STI) structure comprising:
   a bottom portion having a first silicon oxide peripherally enclosed by a silicon substrate; and
   a top portion having a silicon oxide liner peripherally enclosed by the silicon substrate, a silicon liner peripherally enclosed by the silicon oxide liner, and a second silicon oxide peripherally enclosed by the silicon liner, no portion of the silicon oxide liner and no portion of the silicon liner being disposed between the first silicon oxide and the second silicon oxide at an interface between a first portion of the first silicon oxide and a second portion of the second silicon oxide;
   wherein a top surface area of the first silicon oxide is greater than a bottom surface area of the second silicon oxide.

2. The STI structure of claim 1, wherein a ratio of a height of the top portion to a height of the bottom portion is less than about 4.

3. The STI structure of claim 1, wherein the second silicon oxide is a high density plasma (HDP) oxide.

4. The STI structure of claim 1, wherein the bottom portion includes trace amounts of a nitrogen hydride or silicon.

5. The STI structure of claim 1, wherein an aspect ratio of the top portion is about five or less.

6. The structure of claim 1, wherein the second silicon oxide contacts the silicon oxide liner, the silicon liner, and the first silicon oxide at an interface between the top portion and the bottom portion.

7. A shallow trench isolation (STI) structure comprising:
   a silicon substrate having a trench;
   a silicon oxide liner in a top portion of the trench;
   a silicon liner in the top portion of the trench and on the silicon oxide liner;
   a first silicon oxide filler in the top portion of the trench, the silicon liner being disposed between the first silicon oxide filler and the silicon oxide liner; and
   a second silicon oxide filler in a bottom portion of the trench, the second silicon oxide filler contacting the silicon oxide liner, the silicon liner, and the first silicon oxide filler at an interface between the top portion of the trench and the bottom portion of the trench.

8. The STI structure of claim 7, wherein a ratio of a height of the top portion to a height of the bottom portion is less than about 4.

9. The STI structure of claim 7, wherein an aspect ratio of the top portion is about five or less.

10. The STI structure of claim 7, wherein an aspect ratio of the trench is greater than 8.

11. The STI structure of claim 7, wherein the second silicon oxide filler contacts a sidewall silicon surface of the trench and a bottom silicon surface of the trench.

12. The STI structure of claim 7, wherein the silicon oxide liner contacts a sidewall silicon surface of the trench.

13. A structure comprising:
   a semiconductor substrate having a trench defined by semiconductor sidewalls and a semiconductor bottom surface; and
   an isolation region in the trench, the isolation region comprising:
     an oxide liner in a top portion of the isolation region and along the semiconductor sidewalls,
     a semiconductor liner in the top portion of the isolation region and along the oxide liner, the oxide liner being disposed between the semiconductor liner and the semiconductor sidewalls,
     a first oxide filler in the top portion of the isolation region, the semiconductor liner being disposed between the oxide liner and the first oxide filler, and
     a second oxide filler in a bottom portion of the isolation region, the second oxide filler contacting the semiconductor sidewalls, the semiconductor bottom surface and the first oxide filler.

14. The structure of claim 13, wherein the isolation region surrounds an active device region in the semiconductor substrate.

15. The structure of claim 13, wherein a ratio of a height of the top portion to a height of the bottom portion is less than about 4.

16. The structure of claim 13, wherein an aspect ratio of the top portion is about five or less.

17. The structure of claim 13, wherein an aspect ratio of the isolation region is greater than 8.

18. The structure of claim 13, wherein the second oxide filler contacts the oxide liner and the semiconductor liner.

19. The structure of claim 13, wherein the oxide liner is a silicon oxide liner, the semiconductor liner is a silicon liner, and each of the first oxide filler and the second oxide filler are silicon oxide.

20. The structure of claim 13, wherein the second oxide filler includes trace amounts of a nitrogen hydride or elemental silicon.

21. The structure of claim 13, wherein the semiconductor substrate is a silicon substrate.

\* \* \* \* \*